(12) United States Patent
Yamasaki et al.

(10) Patent No.: US 7,284,307 B2
(45) Date of Patent: Oct. 23, 2007

(54) METHOD FOR MANUFACTURING WIRING BOARD

(75) Inventors: Tomoo Yamasaki, Nagano (JP); Noriyoshi Shimizu, Nagano (JP); Kiyoshi Oi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 163 days.

(21) Appl. No.: 11/253,942

(22) Filed: Oct. 19, 2005

(65) Prior Publication Data
US 2006/0130303 A1 Jun. 22, 2006

(30) Foreign Application Priority Data
Dec. 17, 2004 (JP) .............................. 2004-366622

(51) Int. Cl.
*H01G 7/00* (2006.01)
(52) U.S. Cl. .................. 29/25.41; 29/592.1; 29/832; 29/842; 29/847; 29/852; 216/63; 219/121.71; 257/306; 257/310; 257/528; 257/532; 361/301.1; 361/302.2; 361/301.4; 361/309; 361/311; 438/239; 438/386; 438/393
(58) Field of Classification Search .............. 29/25.41, 29/592.1, 832, 842, 847, 852; 216/63; 219/121.71; 257/306, 310, 528, 532; 361/301.1, 302.2, 361/301.4, 309, 311; 427/9, 559, 585; 438/239, 438/386, 393
See application file for complete search history.

(56) References Cited

U.S. PATENT DOCUMENTS

| | | | |
|---|---|---|---|
| 6,278,153 B1 * | 8/2001 | Kikuchi et al. ............. 257/310 |
| 6,603,202 B2 * | 8/2003 | Sasaki et al. ............... 257/701 |
| 7,072,167 B2 * | 7/2006 | Borland ...................... 361/302 |
| 2003/0173676 A1 | 9/2003 | Horikawa | |
| 2003/0223177 A1 | 12/2003 | Higashi et al. | |
| 2004/0104451 A1 | 6/2004 | Ooi et al. | |
| 2004/0183187 A1 | 9/2004 | Yamasaki et al. | |

FOREIGN PATENT DOCUMENTS

| | | |
|---|---|---|
| JP | 2003 264253 | 9/2003 |
| JP | 2004 14573 | 1/2004 |
| JP | 2004 152883 | 5/2004 |
| JP | 2004 281830 | 10/2004 |

* cited by examiner

Primary Examiner—Paul D. Kim
(74) Attorney, Agent, or Firm—Ladas & Parry LLP

(57) ABSTRACT

A method for manufacturing a wiring board, comprising the steps of: forming a first electrode layer having first and second opening portions, forming a dielectric layer formed on the first electrode layer and having third and fourth opening portions, forming a second electrode layer formed on the dielectric layer and having fifth and sixth opening portions, wherein the first electrode layer, the dielectric layer, and the second electrode layer form a capacitor; forming an insulating layer inside a first opening defined by the first, third, and fifth opening portions, and a second opening defined by the second, fourth, and sixth opening portions; using a laser beam having a processing diameter to form first and second via holes extending through the insulating layer formed inside the first and second openings, respectively; and forming first and second via wiring portions in the first and second via holes, respectively.

12 Claims, 13 Drawing Sheets

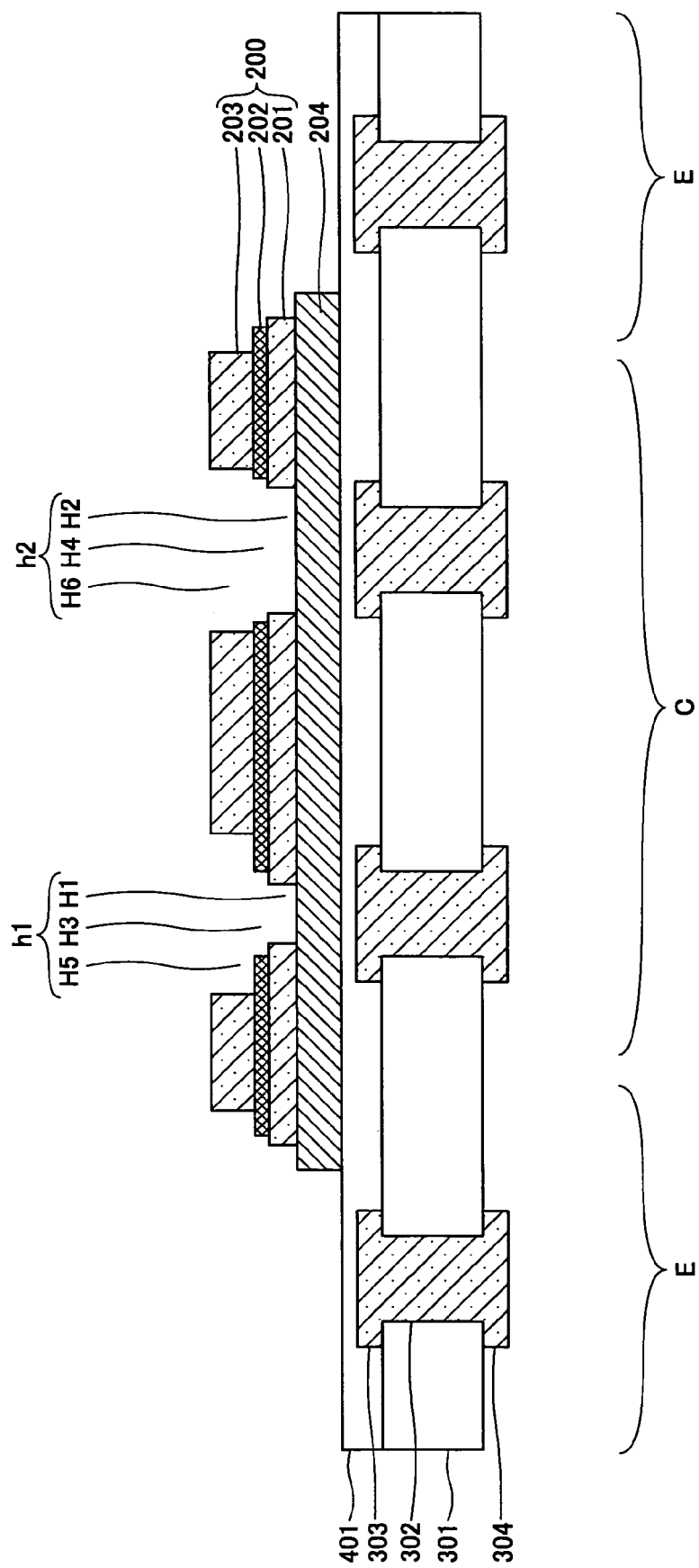

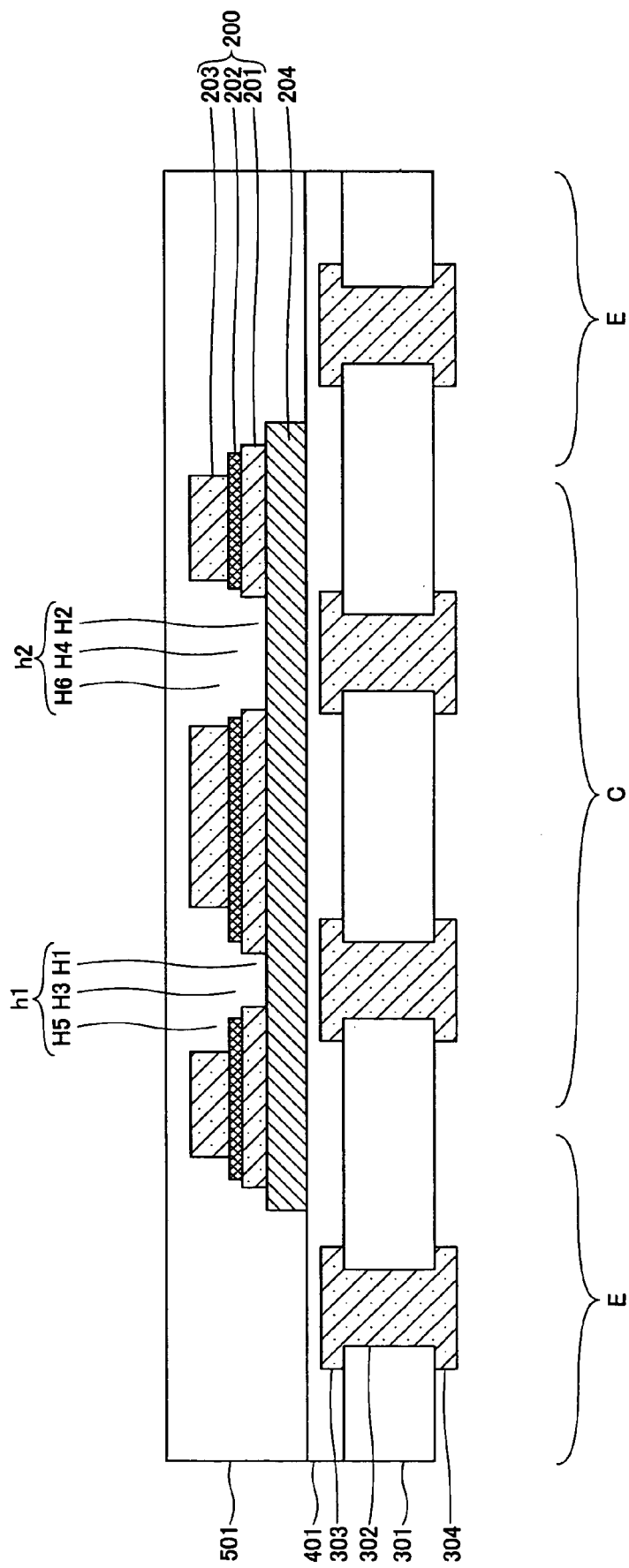

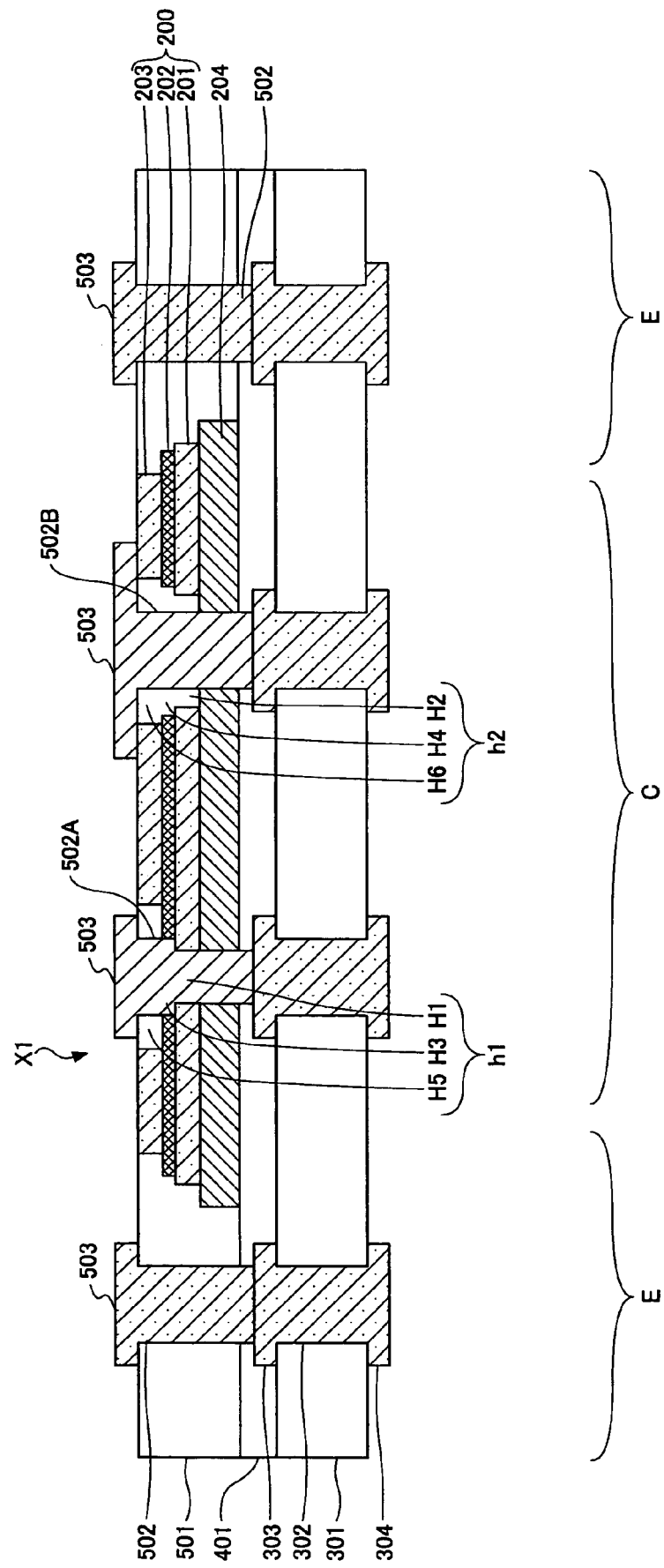

METHOD FOR MANUFACTURING WIRING BOARD

BACKGROUND OF THE INVENTION

1. Field of the Invention

The present invention relates to a method for manufacturing a wiring board to which a semiconductor chip is to be connected, including a decoupling capacitor for the semiconductor chip.

2. Description of the Related Art

In recent years, with the reduction of the size and thickness of semiconductor devices, such as semiconductor chips, a demand for reducing the size and thickness of decoupling capacitors has been growing. Decoupling capacitors (also called decoupling condensers or bypass condensers) are used for reducing voltage variations of semiconductor chips and stabilizing operations thereof.

The operating frequency of semiconductor chips is expected to be increased for improving the operation speed of the semiconductor chips. In such circumstances, decoupling capacitors are preferably arranged near semiconductor chips so as to lower the inductance due to connection of decoupling capacitors.

To meet such preferences, various decoupling capacitors and methods for arranging a decoupling capacitor are suggested.

For example, Patent Document 1 discloses a method that mounts a semiconductor chip on a wiring board, and mounts a decoupling capacitor on a backside of the wiring board (the side opposite to the side on which the semiconductor chip is mounted). Patent Documents 2-4 disclose a structure wherein a decoupling capacitor is embedded in a wiring board.

[Patent Document 1] Japanese Patent Laid-Open Publication No. 2003-264253

[Patent Document 2] Japanese Patent Laid-Open Publication No. 2004-14573

[Patent Document 3] Japanese Patent Laid-Open Publication No. 2004-152883

[Patent Document 4] Japanese Patent Laid-Open Publication No. 2004-281830

However, in the case where a decoupling capacitor is embedded in a wiring board on which a semiconductor chip is mounted, a wiring structure between the semiconductor chip and the decoupling capacitor might cause a problem.

For example, if minute wiring members are used for connecting a decoupling capacitor to a semiconductor chip, electrodes of the decoupling capacitor might not be securely connected to the wiring members. Therefore, it is difficult to secure the connection while lowering the impedance.

SUMMARY OF THE INVENTION

The present invention provides a novel and effective method to solve at least one problem described above.

More specifically, the present invention provides a wiring board including a decoupling capacitor to secure connection between a semiconductor chip and the decoupling capacitor.

According to an aspect of the present invention, there is provided a method for manufacturing a wiring board to which a semiconductor chip is to be connected, comprising the steps of: forming a first electrode layer having first and second opening portions, forming a dielectric layer formed on the first electrode layer and having third and fourth opening portions, forming a second electrode layer formed on the dielectric layer and having fifth and sixth opening portions, wherein the first electrode layer, the dielectric layer, and the second electrode layer form a capacitor; forming an insulating layer inside a first opening defined by the first, third, and fifth opening portions, and a second opening defined by the second, fourth, and sixth opening portions; using a laser beam having a processing diameter to form first and second via holes extending through the insulating layer formed inside the first and second openings, respectively; and forming first and second via wiring portions in the first and second via holes, respectively, the first via wiring portion being connected to the first electrode layer and extending through the capacitor, and the second via wiring portion being connected to the second electrode layer and extending through the capacitor; wherein a diameter of the first opening portion formed in the first electrode layer is smaller than the processing diameter, and a diameter of the second opening portion formed in the first electrode layer is greater than the processing diameter.

With this wiring board manufacturing method, it becomes possible to manufacture a wiring board including a capacitor that secures connection between a semiconductor chip and the capacitor.

Preferably, each diameter of the fifth and sixth opening portions formed in the second electrode layer is greater than the processing diameter. With this configuration, the wiring board including the capacitor can secure the connection between the semiconductor chip and the capacitor.

It is also preferable that a diameter of the third opening portion formed in the dielectric layer be greater than the diameter of the first opening portion formed in the first electrode layer. With this configuration, the wiring board including the capacitor can secure the connection between the semiconductor chip and the capacitor.

It is also preferable that the second via wiring portion be electrically connected to the second electrode layer. With this configuration, the wiring board including the capacitor can secure the connection between the semiconductor chip and the capacitor.

It is also preferable that a lower wiring structure including first and second lower via wiring portions connected to the first and second via wiring portions be formed at the side of the first electrode layer of the capacitor. With this configuration, the wiring board including the capacitor is provided with a multilayered wiring structure and able to secure the connection between the semiconductor chip and the capacitor.

It is also preferable that an upper wiring structure including first and second upper via wiring portions connected to the first and second via wiring portions be formed at the side of the second electrode layer of the capacitor. With this configuration, the wiring board including the capacitor is provided with a multilayered wiring structure and able to secure the connection between the semiconductor chip and the capacitor.

It is also preferable that the first wiring portion be connected to either one of a power supply line or a ground line of the semiconductor chip, and the second wiring portion be connected to the other one of the power supply line or the ground line. With this configuration, supply voltage is stabilized, and the reliability of the wiring board is improved.

It is also preferable that the capacitor be formed on a support that supports the capacitor, and the support be removed after the capacitor is formed. With this method, it is possible to provide a wiring board including a capacitor with reduced thickness.

It is also preferable that a core substrate that supports the capacitor be interposed between the capacitor and the support. With this method, it is possible to provide a wiring board including a highly reliable capacitor.

It is also preferable that the first and second via holes be formed to extend through the core substrate. This makes it easy to form a multilayer wiring structure.

It is also preferable that the capacitor be formed such that the first electrode layer is in contact with the support, and the support be removed after the capacitor is formed. With this method, the capacitor is formed without using the core substrate, thereby reducing the thickness of the capacitor and the wiring board.

It is also preferable that the dielectric layer be made of $Ta_2O_5$, $Al_2O_3$, $TiO_2$, $Nb_2O_5$, STO, BST, PZT, or BTO. The capacity of the capacitor is increase with use of anyone of these materials.

BRIEF DESCRIPTION OF THE DRAWINGS

FIGS. 3A-3G illustrate a method for manufacturing a wiring board according to the first embodiment;

DETAILED DESCRIPTION OF THE PREFERRED EMBODIMENT

The following description provides exemplary embodiments of the present invention with reference to the accompanying drawings.

First Embodiment

Figure 1:
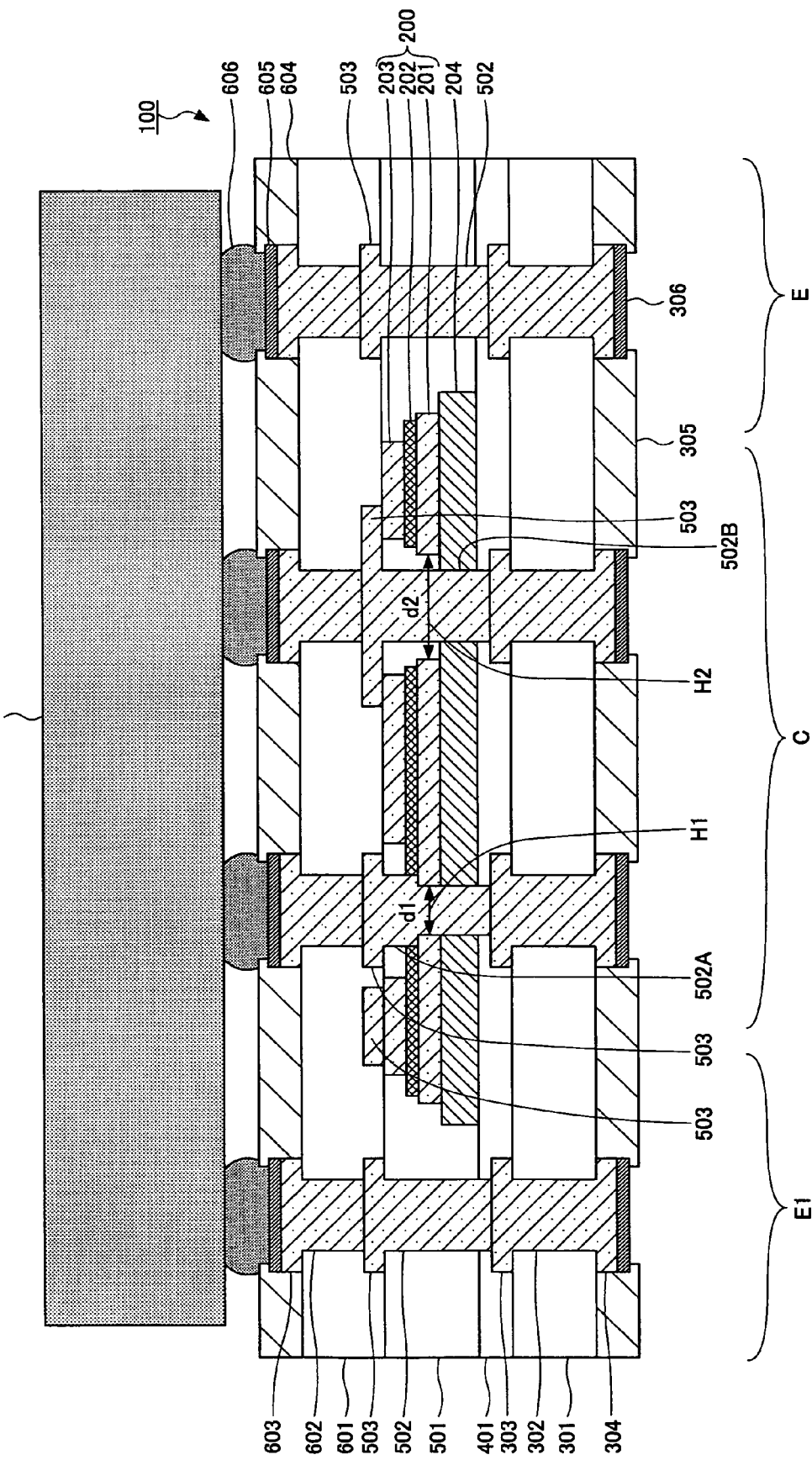
FIG. 1 is a schematic cross-sectional view of a wiring board according to a first embodiment.

FIG. 1 is a schematic cross-sectional view of a wiring board 100 to which a semiconductor chip 1 is connected, including a decoupling capacitor 200 (hereinafter referred to as capacitor) according to a first embodiment of the present invention.

Referring to FIG. 1, the wiring board 100 comprises a first principal face, and a second principal face at the opposite side of the first principal face. The semiconductor chip 1 is connected to the first principal face, while a mother board, for example, is connected to the second principal face. In the following description, the side of the wiring board 100 on which the semiconductor chip 1 is arranged is defined as the upper side, and the side opposite to the upper side is defined as the lower side.

In the wiring board 100, the capacitor 200 is arranged on a core substrate 204. The capacitor 200 includes a lower electrode layer 201 formed on the core substrate 204, a dielectric layer 202 formed on the lower electrode layer 201, and an upper electrode layer 203 formed on the dielectric layer 202.

The lower electrode layer 201 is electrically connected to either one of a power supply line or a ground line of the semiconductor chip 1, and the upper electrode layer 203 is electrically connected to the other one of the power supply line or the ground line. That is, the capacitor 200 is inserted between the power supply line and the ground line so as to stabilize supply voltage and operations of the semiconductor chip 1.

According to this embodiment, the capacitor 200 is electrically connected to the semiconductor chip 1 by a via wiring portion 502A and a via wiring portion 502B extending through the capacitor 200. The semiconductor chip 1 is connected to the power supply line and the ground line at the side of the second principal face of the wiring board 100 by the via wiring portion 502A and the via wiring portion 502B.

This configuration can reduce the installation space of the capacitor 200, thereby reducing the thickness and the size of the wiring board 100 with the capacitor 200 embedded therein. The via wiring portions 502A and 502B extend through corresponding openings h1 and h2 (FIG. 2C) formed in the capacitor 200, respectively.

An insulating layer 501 is formed around the capacitor 200 and in the openings h1 and h2. The via wiring portions 502A and 502B are formed in via holes BH (FIG. 3E) extending through the insulating layer 501 filling the openings h1 and h2 as well as the core substrate 204.

The insulating layer 501 surrounding the capacitor 200 has a lower end face substantially flush with a lower end face of the core substrate 204, and has an upper end face substantially flush with an upper end face of the upper electrode layer 203. Wiring patterns 503 are formed on the insulating layer 501 and the upper electrode layer 203 so as to be connected to the via wiring portions 502A and 502B.

The via wiring portion 502B is connected to the upper electrode layer 203 by the wiring pattern 503.

The via wiring portion 502A is connected to the lower electrode layer 201. A diameter d1 of an opening portion H1 formed in the lower electrode layer 201 is smaller than a processing diameter of a laser beam applied to form the via hole BH for the via wiring portion 502A (or than a diameter of the via hole BH at a part surrounded by the insulating layer 501, which is also referred to as "processing diameter of the via hole"). A YAG laser, for example, used for processing the insulating layer 501 is not able to pierce a material, e.g., Cu, of the lower electrode layer 201.

Therefore, the diameter of the via wiring portion 502A at the upper side of an upper end face of the lower electrode layer 201 is larger than the diameter of the via wiring portion 502A at the lower side of the upper end face of the lower electrode layer 201. Accordingly, the contact area between the via wiring portions 502A and the lower electrode layer 201 is increased, thereby improving the reliability of the connection between the via wiring portion 502A and the lower electrode layer 201. Thus, the connection impedance between the capacitor 200 and the semiconductor chip 1 is lowered. A method for forming the via wiring portions 502A and 502B is described below in greater detail.

An insulating layer 601 is formed on the wiring patterns 503 and the insulating layer 501. Via holes are formed in the insulating layer 601. Via wiring portions 602 are formed in the corresponding via holes. Wiring patterns 603 are formed on the insulating layer 601 and the via wiring portions 602.

Plating layers 605 are formed on the corresponding wiring patterns 603 so as to provide for electrical connection. A solder resist layer 604 having openings for exposing the plating layers 605 is formed on the insulating layer 601. Connection terminals, such as solder bumps 606, are formed on the plating layers 605. The solder bumps 606 are electrically connected to, for example, electrode pads of the semiconductor chip 1.

The via wiring portion 502A is connected to the semiconductor chip 1 by the wiring pattern 503, the via wiring portion 602, and the wiring pattern 603. Similarly, the via wiring portion 502B is connected to the semiconductor chip 1 by the wiring pattern 503, the via wiring portion 602, and the wiring pattern 603.

An insulating layer 401 is formed on the lower side of the core substrate 204 and the insulating layer 501. Further, an insulating layer 301 is formed on the lower side of the insulating layer 401.

Via wiring portions 302 are formed in the insulating layer 301. Wiring patterns 303 are formed on the upper side of the insulating layer 301 so as to be connected to the via wiring portions 302. Wiring patterns 304 are formed on the lower side of the insulating layer 301 so as to be connected to the via wiring portions 302. Plating layers 306 are formed on the lower side of the wiring patterns 304 so as to secure electrical connection. A solder resist layer 305 having openings for exposing the plating layers 306 is formed to cover the insulating layer 301.

The via wiring portions 502A and 502B extend through the insulating layer 501 into the insulating layer 401 so as to be connected to the corresponding wiring patterns 303.

That is, the power supply line and the ground line of the semiconductor chip 1 are connected to corresponding terminals formed on the second principal face by the corresponding via wiring portions 502A and 502B between the first principal face and the second principal face. The capacitor 200 is inserted between the power supply line and the ground line. The power supply line and the ground line extend through the capacitor 200.

This configuration allows reduction of the thickness and size of the wiring board 100 with the semiconductor chip 1 mounted thereon.

The power supply line and the ground line are formed, for example, in a center part (region C shown in FIG. 1) of the wiring board 100. Lines such as signal lines are formed, for example, in end part (region E shown in FIG. 1) of the wiring board 100.

That is, in the insulating layer 501, the via wiring portion 502A connected to either one of the power supply line or the ground line and the via wiring portion 502B connected to the other one of the power supply line or the ground line are formed in the region C while plural via wiring portions 502 to be connected to, for example, the signal lines formed in the region E. As with the via wiring portions 502A and 502B, the via wiring portions 502 are electrically connected to the semiconductor chip 1 so as to connect the signal lines of the semiconductor chip 1 at the first principal face side of the wiring board 100 to the second principal face side.

The following describes a method for manufacturing the wiring board 100. To begin with, a method for manufacturing the capacitor 200 to be embedded in the wiring board 100 is described with reference to FIGS. 2A-2D. In FIGS. 2A-2D and the following description, components identical to those already illustrated bear the same reference numbers and are not further described herein.

Figure 2A:
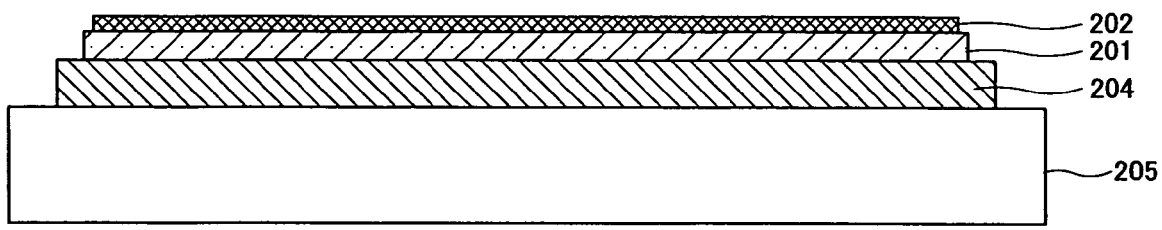
FIGS. 2A-2D illustrate a method for manufacturing a capacitor according to the first embodiment.

In a step shown in FIG. 2A, a support 205 made of, e.g., silicon, glass, or ceramic is prepared for supporting the capacitor 200. The core substrate 204 of polyimide with a thickness of, e.g., 10 μm is formed on the support 205.

Then, the lower electrode layer 201 is formed on the core substrate 204. The lower electrode layer 201 may be a Cu plating layer of, e.g., 10 μm thickness. To facilitate the formation of the Cu plating layer, it is preferable to form a Cr/Cu seed layer in advance that includes a lamination structure of a Cu sputtering layer of, e.g., 500 nm thickness and a Cr sputtering layer of, e.g., 50 nm thickness.

Subsequently, the dielectric layer 202 is formed on the lower electrode layer 201. The dielectric layer 202 may be a Ta anodic oxide film ($Ta_2O_5$ film) of, e.g., 300 nm thickness, which is oxidized at a formation voltage of, e.g., 200V using a citric acid solution. The dielectric layer 202 is not limited to the $Ta_2O_5$ film, and may alternatively be a ferroelectric film for increasing the capacity of the capacitor 200. Example of the ferroelectric film includes a film made of $Al_2O_3$, $TiO_2$, $Nb_2O_5$, STO ($SrTiO_3$: strontium titanate), BST ($(Ba, Sr)TiO_3$: barium strontium titanate), PZT ($Pb(Zr, Ti)O_3$: lead zirconate titanate), or BTO ($BaTiO_3$: barium titanate). These films may be formed by various methods such as a CVD (chemical vapor deposition) method or aerosol deposition method.

Figure 2B:
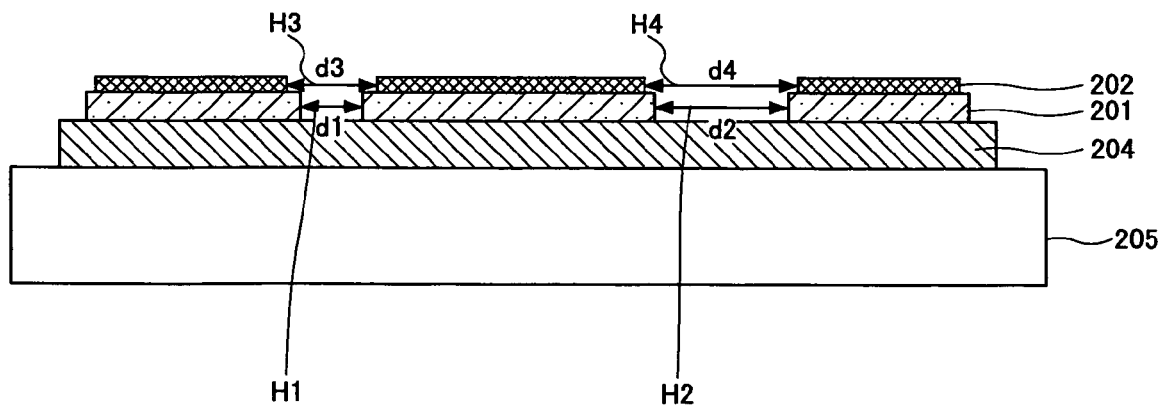

In a step shown in FIG. 2B, opening portions H3, H4 and opening portions H1, H2 are formed in the dielectric layer 202 and the lower electrode layer 201, respectively, by photolithography and etching.

First, a resist pattern is formed on the dielectric layer 202 by photolithography. The opening portion H3 with a diameter d3 and the opening portion H4 with a diameter d4 are formed in the dielectric layer 202 by etching such as plasma dry etching and wet etching.

Then, after removing the resist pattern, a resist pattern is newly formed by photolithography on the lower electrode layer 201 exposed through the opening portions H3 and H4. The opening portion H1 with a diameter d1 and the opening portion H2 with a diameter d2 are formed in the lower electrode layer 201 exposed through the opening portion H3 and the opening portion H4, respectively, by etching such as plasma dry etching and wet etching.

Preferably, the diameter d1 of the opening portion H1 is smaller than the diameter of the processing diameter of the laser beam applied to form the via hole BH in the insulating layer formed in the opening portion H1 in a later step. With this configuration, the via wiring portion 502A to be formed in a later process to extend through the opening portion H1 has a larger contact area with the lower electrode layer 201 (see FIG. 1), so that the impedance at a contact part of the via wiring portion 502A and the lower electrode layer 201 is lowered. The lower electrode layer 201 may serve as a mask to improve the positioning accuracy of the via wiring portion 502A.

It is also preferable that the diameter d3 of the opening portion H3 formed in the dielectric layer 202 be greater than the diameter d1. Making the diameter d3 greater than the diameter d1 increases the exposed area of the lower electrode layer 201. Accordingly, the via wiring portion 502A to be formed in a later step has a larger contact area with the lower electrode layer 201.

In the illustrated embodiment, the diameter d2 of the opening portion H2 is greater than the processing diameter of the laser beam. This is because the via wiring portion 502B, which is formed to extend through the opening portion H2 in a later step, is to be connected to the upper electrode layer 203 while being prevented from contact with an inner wall of the opening portion H2.

Figure 2C:
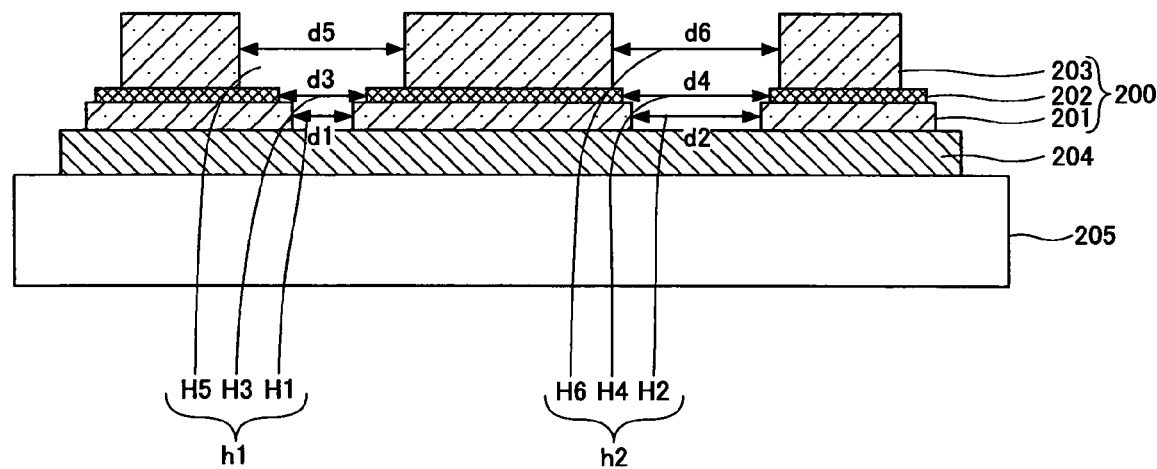

Then, in a step shown in FIG. 2C, the upper electrode layer 203 of, e.g., Cu with a thickness of, e.g., 20 μm having opening portions H5 and H6 is formed on the dielectric layer 202 by a pattern plating method such as a semi-additive method. As with the lower electrode layer 201, a Cr/Cu seed layer is preferably formed in advance for facilitating the formation of the Cu plating layer. The opening portion H5 with a diameter d5 corresponding to the opening portions H1 and H3, and the opening portion H6 with a diameter d6 corresponding to the opening portions H2 and H4 are formed in the upper electrode layer 203.

Thus, the opening h1 including the opening portions H1, H3 and H5, and the opening h2 including the opening portions H2, H4, and H6 are formed.

In the illustrated embodiment, the diameter d5 is greater than the diameter of the processing diameter of the laser beam. This is because the via wiring portion 502A, which is formed in a later step to extend through the opening portion H5, is to be connected to the lower electrode layer 201 while being prevented from contact with an inner wall of the opening portion H5.

In the illustrated embodiment, the diameter d6 is greater than the processing diameter of the laser beam. This is because the via wiring portion 502B, which is formed in a later step, is to be connected to the upper electrode layer 203 through the wiring pattern 503, which is formed on the upper electrode layer 203 in a later step.

In one example, when the processing diameter of the laser beam is 75 μm, it is preferable that the diameter d1 be 50 μm or less and that the diameters d2 and d5 be 150 μm or greater.

Although the opening portions H1 and H3 are formed in the lower electrode layer 201 by photolithography and plasma dry etching in the step shown in FIG. 2B, the opening portions H1 and H3 may be formed in advance in the step shown in FIG. 2A by a pattern plating method such as a semi-additive method.

Figure 2D:
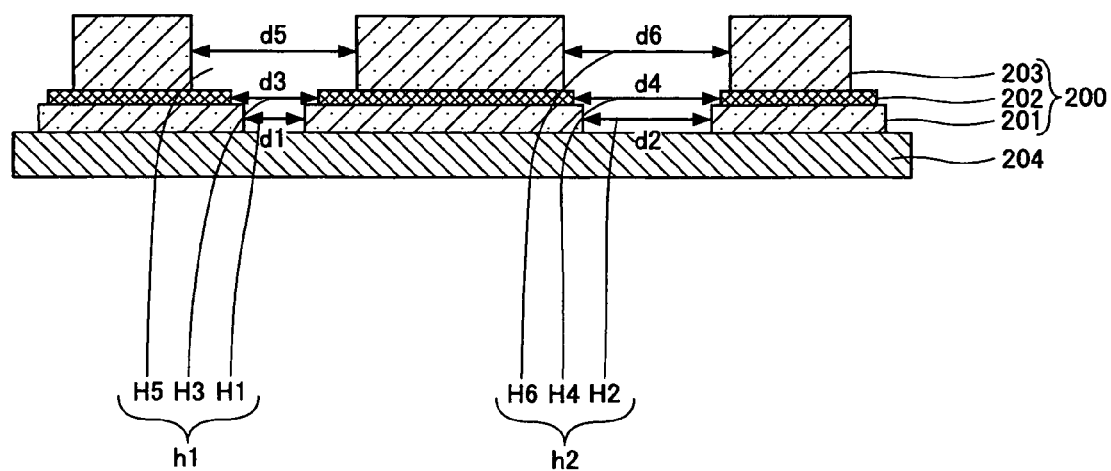

In a step shown in FIG. 2D, the support 205 is separated from the core substrate 204 by, e.g., wet etching so as to obtain the capacitor 200 arranged on the core substrate 204. The thickness of the wiring board 100 with the capacitor 200 embedded therein is reduced by the removal of the support 205.

A method for forming the wiring board 100 with the above-described capacitor 200 embedded therein is described with reference to FIGS. 3A-3G.

Figure 3A:
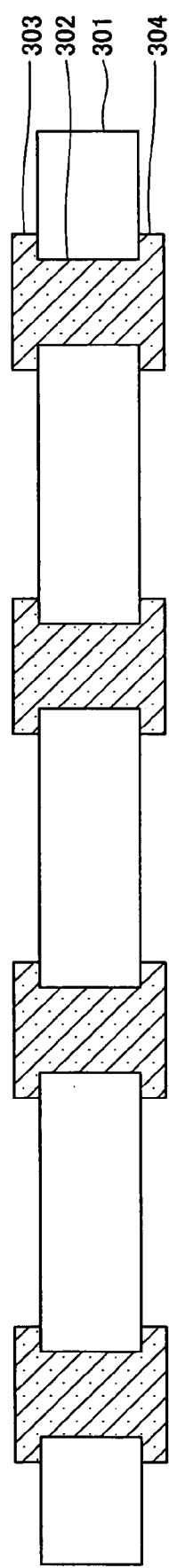

In a step shown in FIG. 3A, via holes are formed in the insulating layer 301 made of, e.g., a resin material. The via wiring portions 302 are formed in the via holes by plating. Then, with use of a pattern plating method such as semi-additive method, the wiring patterns 303 of, e.g., Cu are formed on the upper side of the insulating layer 301 while the wiring patterns 304 of, e.g., Cu are formed on the lower side of the insulating layer 301. Alternatively, the wiring patterns 303 and 304 may be formed by forming a uniform Cu film on the insulating layer 301 and etching the Cu film.

In a step shown in FIG. 3B, the insulating layer 401 of, e.g., epoxy resin is formed to cover the insulating layer 301 and the wiring patterns 303 by a lamination method or a coating method. The capacitor 200 arranged on the core substrate 204 is mounted on the insulating layer 401.

In a step shown in FIG. 3C, the insulating layer 501 of, e.g., epoxy resin is formed on the capacitor 200 and the insulating layer 401 by a lamination method or a coating method so as to cover the capacitor 200.

Figure 3D:
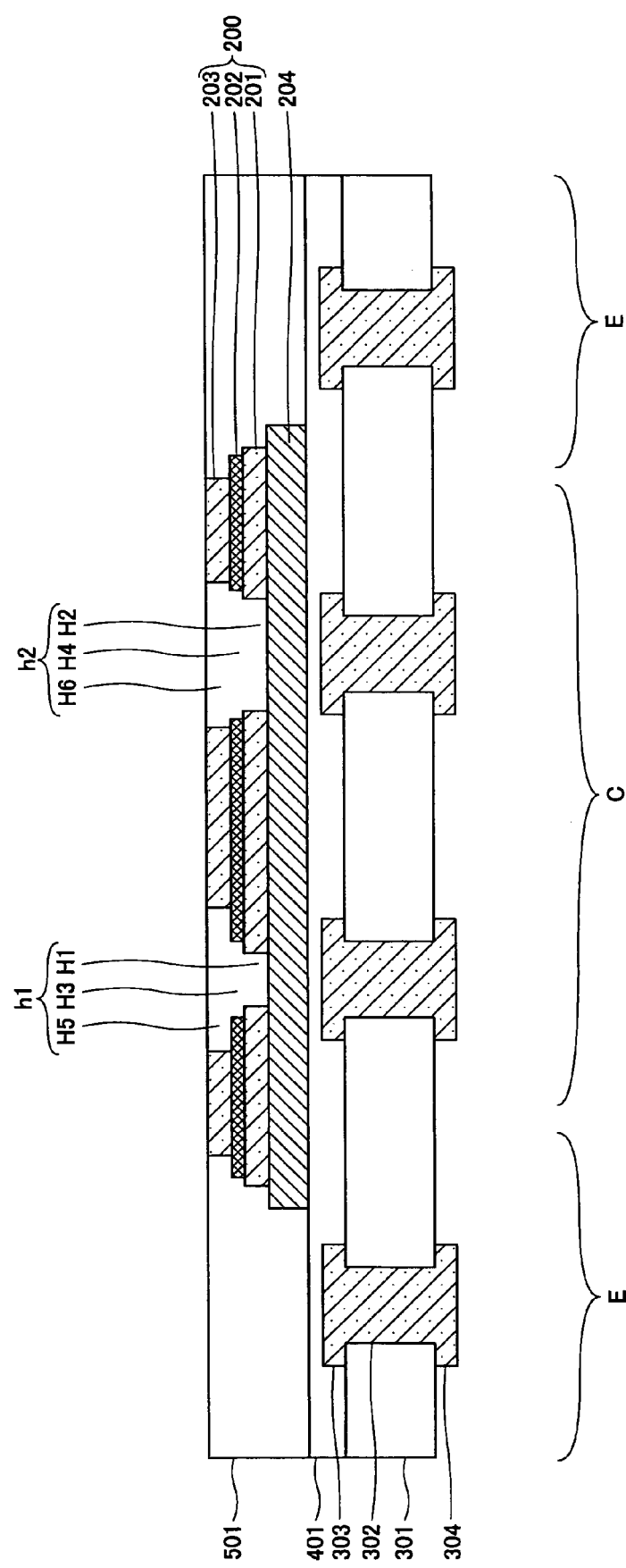

Then, in a step shown in FIG. 3D, the insulating layer 501 is subjected to surface grinding, such as buffing, so as to expose the upper electrode layer 203.

Figure 3E:
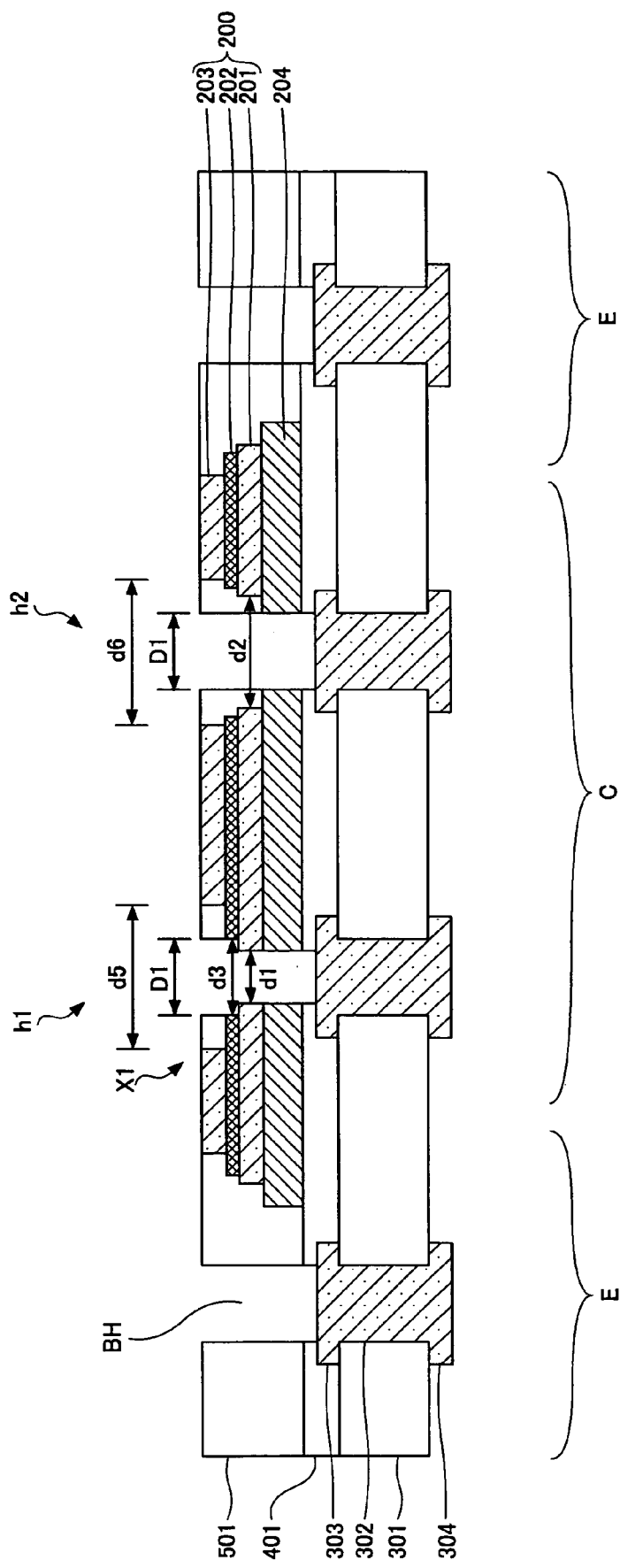

In a step shown in FIG. 3E, the plural via holes BH that extend through the insulating layer 501 to reach the wiring patterns 303 are formed using, e.g., a YAG laser.

Since in the exemplary embodiment the processing diameter of the laser beam of the YAG laser is 75 μm, the diameter of the via holes BH formed in the insulating layer 501 is to be about 75 μm. Accordingly, the diameter of the via holes BH formed in the region E, in which the via wiring portions 502 to be connected to the signal lines are formed, is about 75 μm, for example.

Also, in the exemplary embodiment, a diameter D1 of the via hole BH formed in the insulating layer 501 in the opening h2 is about 75 μm. The via hole BH, with this constant diameter, extends through the core substrate 204 into the insulating layer 401 so as to expose the wiring patterns 303.

The via hole BH formed in the insulating layer 501 in the opening h1 preferably has the same diameter D1 as the other via holes BH at the level between an upper end face of the insulating layer 501 and the upper end face of the lower electrode layer 201. However, the via hole BH at the level below the upper end face of the lower electrode layer 201 (i.e. a portion of the via hole BH inside the portion corresponding to the opening portion H1 (FIG. 1), as well as inside the core substrate 204, and the insulating layer 401), has a diameter approximately equal to the diameter d1. This is because the YAG laser can hardly process the lower electrode layer 201 of, e.g., Cu, and the lower electrode layer 201 serves as a mask during the formation of the via hole BH. Therefore, the via wiring portion 502A formed in the opening h1 is highly accurately positioned and securely connected to the lower electrode layer 201, thereby securing the connection to the capacitor 200.

In a step shown in FIG. 3F, with use of a CU plating method, the via wiring portions 502, 502A and 502B are formed in the via holes BH formed in the step shown in FIG. 3E. Then the wiring patterns 503 are formed directly on the via wiring portions 502, 502A and 502B. As shown in FIG. 3F, the via wiring portions 302 are formed at the first electrode layer 201 side of the capacitor 200, and the via wiring poritons 302 are connected (from left to right in FIG. 1) to the corresponding via wiring portions 502, 502A, 502B and 502 by the respective lower wiring patterns 303.

The via wiring portion 502A formed in the opening h1 is in contact with the lower electrode layer 201 at the periphery of the aforementioned opening portion H1, and also at an outer portion (e.g. annular portion) of the lower face of the aforementioned opening portion H3. Therefore, the reliability of the connection between the via wiring portion 502A and the capacitor 200 becomes more secure and reduces the impedance.

Since the diameter d5 of the opening portion H5 is greater than the processing diameter of the YAG laser, the via wiring portion 502A is out of contact with the upper electrode layer 203.

The via wiring portion 502B formed in the opening h2 is connected to the upper electrode layer 203 by the wiring pattern 503 formed on the via wiring portion 502B. Since the diameter d2 of the opening portion H2 is greater than the processing diameter of the YAG laser, the via wiring portion 502B is out of contact with the lower electrode layer 201.

In this way, the via wiring portions 502A and 502B are formed to be electrically connected to the electrodes of the capacitor 200.

Figure 3G:
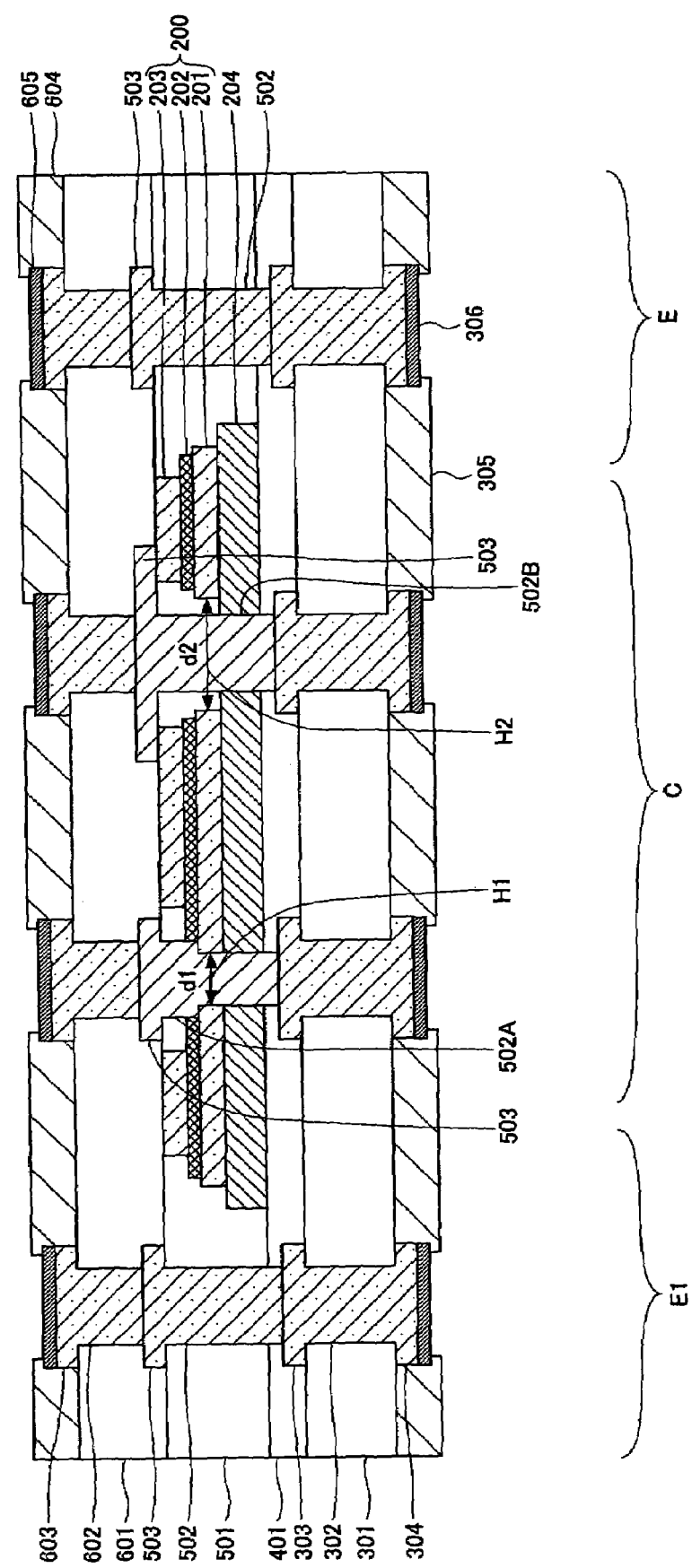

In a step shown in FIG. 3G, the insulating layer 601 of, e.g., epoxy resin is formed to cover the wiring patterns 503 and the insulating layer 501 by a lamination method or a coating method. Then, in a same manner such as that shown and described with respect to FIGS. 3E-3F, the via wiring portions 602 are formed on the wiring patterns 503 so as to be connected thereto, and the wiring patterns 603 are formed on the via wiring portions 602 so as to be connected thereto. Thus, as shown in FIG. 3G, the via wiring portions 602 are formed at the second electrode layer 203 side of the capacitor 200, and the via wiring portions 602 are connected (from left to right in FIG. 3G) to the corresponding via wiring Portions 502, 502A, 502B and 502, by the respective wiring patterns 503. The plating layers 605 of, e.g., Ni/Au are formed on the corresponding wiring patterns 603 so as to provide for electrical connection. The solder resist layer 604 having the openings for exposing the plating layers 605 is formed to cover the insulating layer 601.

It is preferable to have a structure to which connection terminals are connected at the lower side of the wiring board 100 as well. For example, the plating layers 306 of, e.g., Ni/Au are formed on the corresponding wiring patterns 304, and the solder resist layer 305 having the openings for exposing the plating layers 306 is formed to cover the insulating layer 301.

According to the first embodiment of the present invention, since the impedance due to the connection of capacitor is lowered, noise at a high frequency band is effectively reduced. Moreover, since the wiring connected to the capacitor 200 is highly accurately positioned, the connection reliability is improved.

Second Embodiment

Figure 4:
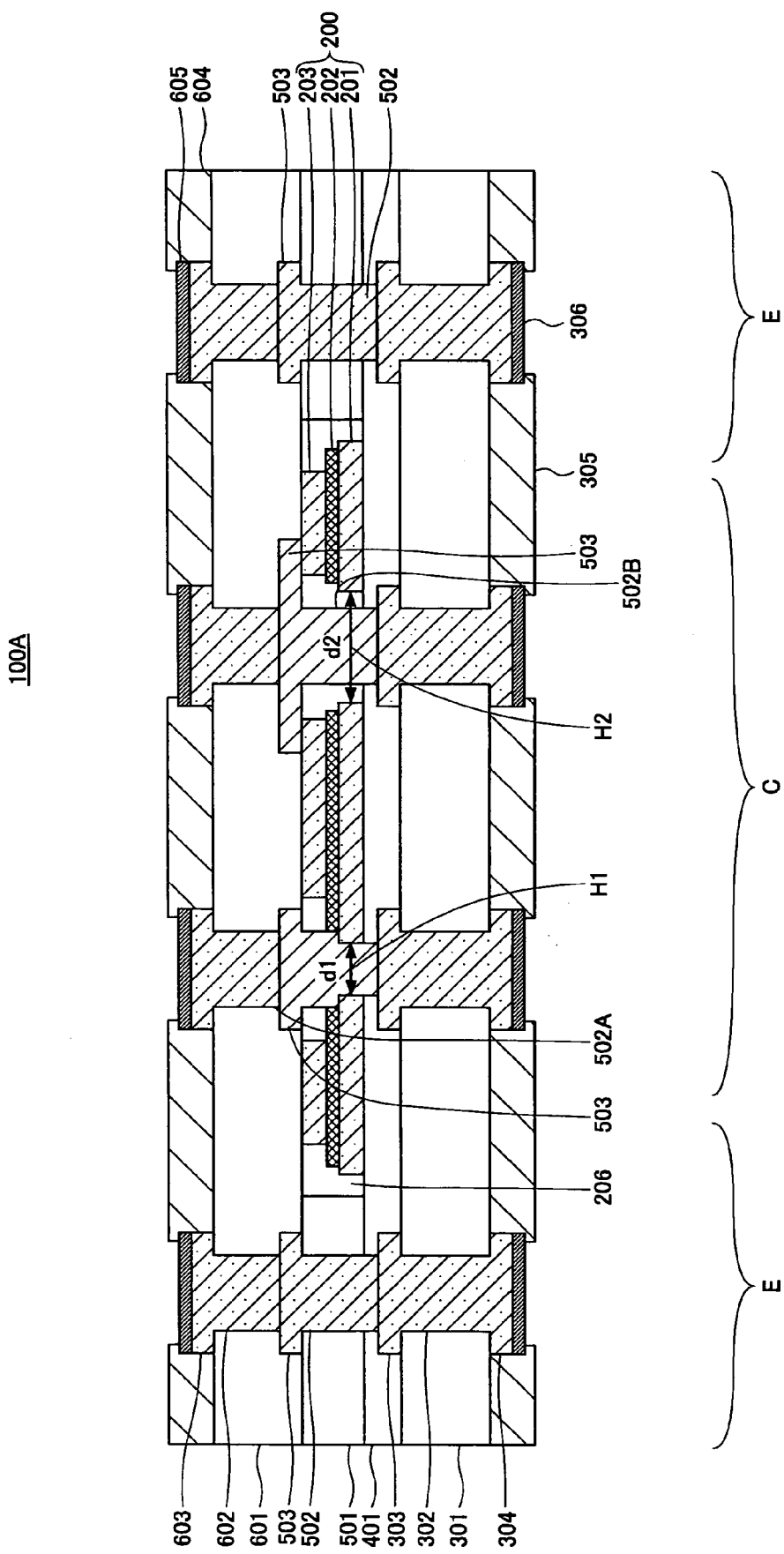
FIG. 4 is a schematic cross-sectional view of a wiring board according to a second embodiment.

The wiring board 100 of the first embodiment may be modified as shown in FIG. 4.

FIG. 4 is a schematic cross-sectional view of a wiring board 100A to which a semiconductor chip 1 is to be connected, including the capacitor 200 according to a second embodiment of the present invention. In FIG. 4, components identical to those already described bear the same reference numbers and are not further described.

Referring to FIG. 4, although the wiring board 100 of the first embodiment includes the core substrate 204 on which the capacitor 200 is mounted, the wiring board 100A does not include the core substrate 204. That is, the lower electrode layer 201 is in contact with the insulating layer 401. Accordingly, the wiring board 100A of the second embodiment can be made thinner and lighter compared to the wiring board 100 of the first embodiment while having the same effects as the wiring board 100.

According the second embodiment, the capacitor 200 may be formed, for example, as illustrated in FIGS. 5A-5E. In FIGS. 5A-5E, components identical to those already described bear the same reference numbers and are not further described.

Figure 5A:
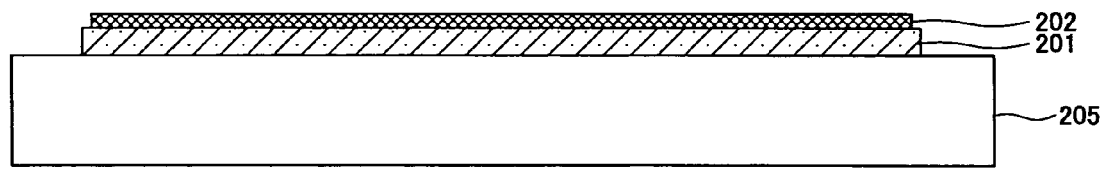
FIGS. 5A-5E illustrate a method for manufacturing a capacitor according to the second embodiment.
Figure 5B:
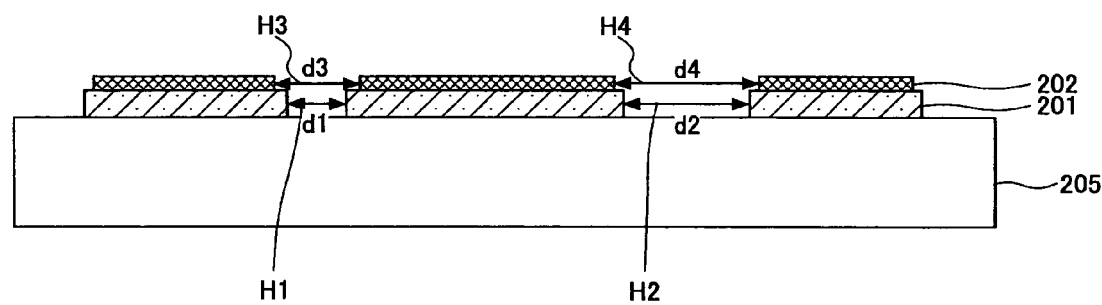
Figure 5C:
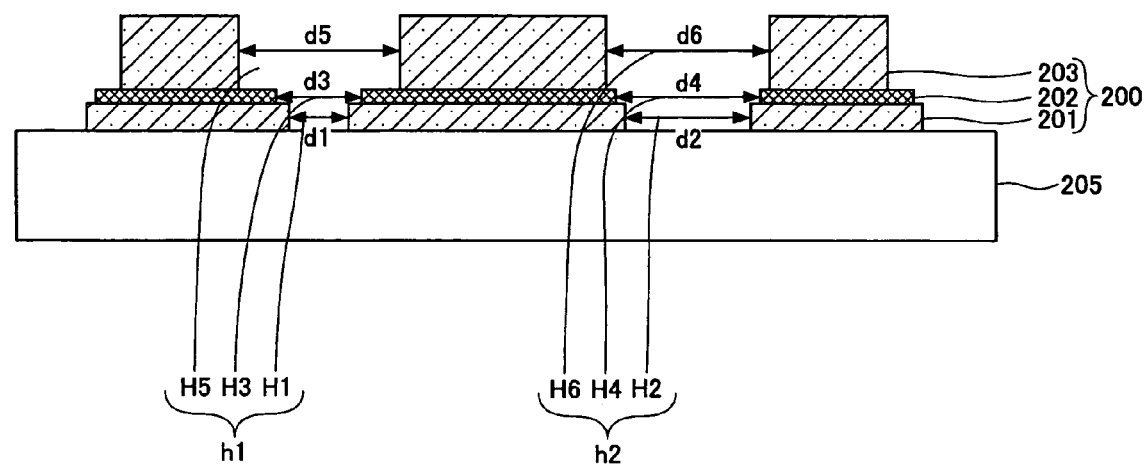

In the steps shown in FIGS. 5A-5C, the lower electrode layer 201, the dielectric layer 202, and the upper electrode layer 203 may be formed, for example, in a manner such as that shown and described with respect to FIGS. 2A-2C. In the second embodiment, the lower electrode layer 201 is formed directly on the support 205 without providing the core substrate 204 on the support 205. Other steps are the same as in the first embodiment.

Figure 5D:
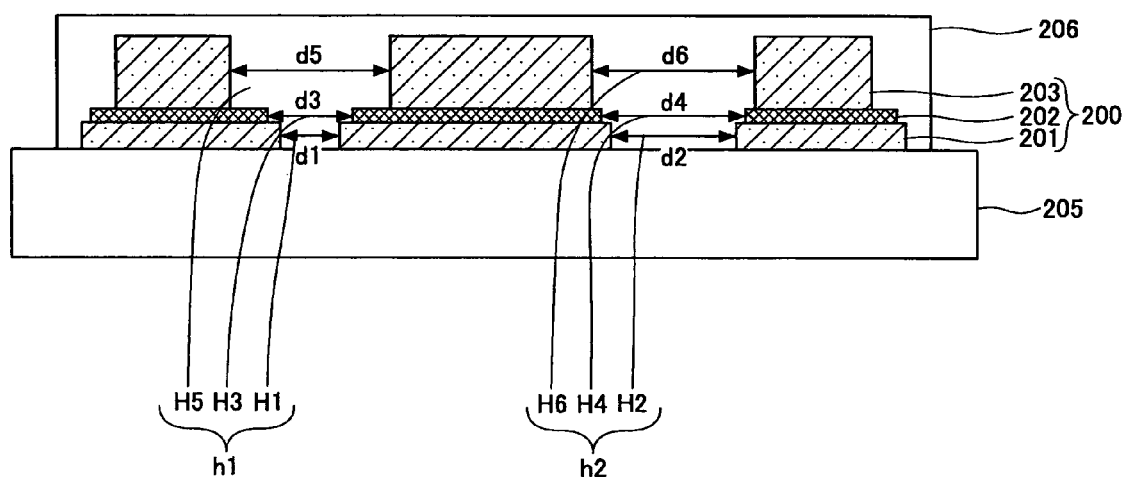

In a step shown in FIG. 5D, an insulating layer 206 of, e.g., epoxy resin is formed on the support 205 and the capacitor 200 by a lamination method or a coating method.

Figure 5E:
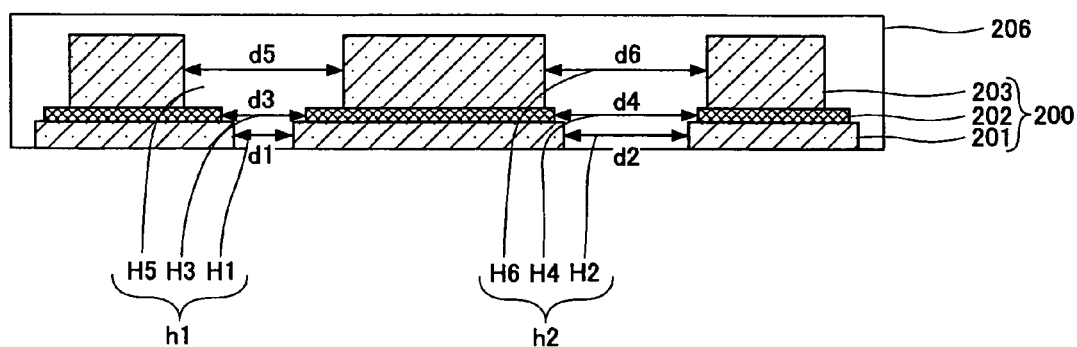

In a step shown in FIG. 5E, the support 205 is separated from the insulating layer 206 and the lower electrode layer 201 by, e.g., wet etching so as to obtain the capacitor 200 held in the insulating layer 206. The wiring board 100A with this capacitor 200 embedded therein may be formed in the same manner as in the first embodiment. According to the second embodiment, the elimination of the core substrate 204 in addition to the removal of the support 205 makes the wiring board 100A with the capacitor 200 embedded therein thinner compared to the first embodiment.

The shape and a wiring structure of the capacitor 200 are not limited to the above-described embodiments, and variations and modifications may be made to the described embodiments. The materials described in the above-described embodiments are only examples, and other materials may be used as will be appreciated.

The present application is based on Japanese Priority Application No. 2004-366622 filed on Dec. 17, 2004, with the Japanese Patent Office, the entire contents of which are hereby incorporated by reference.

What is claimed is:

1. A method for manufacturing a wiring board to which a semiconductor chip is to be connected, comprising the steps of:

forming a first electrode layer having first and second opening portions, forming a dielectric layer formed on the first electrode layer and having third and fourth opening portions, forming a second electrode layer formed on the dielectric layer and having fifth and sixth opening portions, wherein the first electrode layer, the dielectric layer, and the second electrode layer form a capacitor;

forming an insulating layer inside a first opening defined by the first, third, and fifth opening portions, and a second opening defined by the second, fourth, and sixth opening portions;

using a laser beam having a processing diameter to form first and second via holes extending through the insulating layer formed inside the first and second openings, respectively; and forming first and second via wiring portions in the first and second via holes, respectively, the first via wiring portion being connected to the first electrode layer and extending through the capacitor, and the second via wiring portion being connected to the second electrode layer and extending through the capacitor;

wherein a diameter of the first opening portion formed in the first electrode layer is smaller than the processing diameter, and a diameter of the second opening portion formed in the first electrode layer is greater than the processing diameter.

2. The method for manufacturing a wiring board as claimed in claim 1, wherein each diameter of the fifth and sixth opening portions formed in the second electrode layer is greater than the processing diameter.

3. The method for manufacturing a wiring board as claimed in claim 1, wherein a diameter of the third opening portion formed in the dielectric layer is greater than the diameter of the first opening portion formed in the first electrode layer.

4. The method for manufacturing a wiring board as claimed in claim 1, wherein the second via wiring portion is electrically connected to the second electrode layer.

5. The method for manufacturing a wiring board as claimed in claim 1, wherein first and second lower via wiring portions are formed at the first-electrode-layer-side of the capacitor and are connected to the first and second via wiring portions by respective first and second lower wiring patterns.

6. The method for manufacturing a wiring board as claimed in claim 1, wherein first and second wiring patterns are formed on the respective first and second via wiring portions and first and second upper via wiring portions are formed at the second-electrode-layer-side of the capacitor and are connected to the first and second via wiring portions by the respective first and second wiring patterns.

7. The method for manufacturing a wiring board as claimed in claim 1, wherein the first wiring portion is connected to either one of a power supply line or a ground line of the semiconductor chip, and the second wiring portion is connected to the other one of the power supply line or the ground line.

8. The method for manufacturing the wiring board as claimed in claim 1, wherein the capacitor is formed on a support that supports the capacitor, and the support is removed after the capacitor is formed.

9. The method for manufacturing the wiring board as claimed in claim 8, wherein a core substrate that supports the capacitor is interposed between the capacitor and the support.

10. The method for manufacturing the wiring board as claimed in claim 9, wherein the first and second via holes are formed to extend through the core substrate.

11. The method for manufacturing a wiring board as claimed in claim 8, wherein the capacitor is formed such that the first electrode layer is in contact with the support, and the support is removed after the capacitor is formed.

12. The method for manufacturing a wiring board as claimed in claim 1, wherein the dielectric layer is made of $Ta_2O_5$, $Al_2O_3$, $TiO_2$, $Nb_2O_5$, STO, BST, PZT, or BTO.

* * * * *